(12) United States Patent
Kasula et al.

(10) Patent No.: US 10,282,105 B2
(45) Date of Patent: May 7, 2019

(54) EXTENDING SHELF LIFE OF NON-VOLATILE MEMORY DEVICES

(71) Applicant: INTERNATIONAL BUSINESS MACHINES CORPORATION, Armonk, NY (US)

(72) Inventors: Prashanth K. Kasula, Bangalore (IN); Trinadhachari Kosuru, Karnkarnataka (IN); Adam J. McPadden, Underhill, VT (US); Preetham H. Raghavendra, Karnataka (IN); Janani Swaminathan, Tamilnadu (IN)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 15/411,136

(22) Filed: Jan. 20, 2017

(65) Prior Publication Data
US 2018/0210646 A1    Jul. 26, 2018

(51) Int. Cl.
G06F 3/06 (2006.01)
G06F 1/24 (2006.01)
G11C 11/406 (2006.01)

(52) U.S. Cl.
CPC ............ G06F 3/061 (2013.01); G06F 1/24 (2013.01); G06F 3/0625 (2013.01);
(Continued)

(58) Field of Classification Search
CPC .......... G06F 3/061; G06F 1/24; G06F 3/0625; G06F 3/0655; G06F 3/0688
See application file for complete search history.

(56) References Cited

U.S. PATENT DOCUMENTS

| 6,336,174 B1 | 1/2002 | Li et al. |
| 6,856,568 B1 * | 2/2005 | Wong .............. G11C 11/56 |
| | | 365/185.25 |

(Continued)

FOREIGN PATENT DOCUMENTS

| WO | 2010006301 A1 | 1/2010 |
| WO | 2014018038 A1 | 1/2014 |
| WO | 2015097956 A1 | 7/2015 |

OTHER PUBLICATIONS

Mittal et al., "Lasting NV Cache: Extending the Lifetime of Non-volatile Caches using Intra-set Wear-leveling", Oak Ridge National Laboratory (2014); 14 pgs.

*Primary Examiner* — Jerome Leboeuf
(74) *Attorney, Agent, or Firm* — Cantor Colburn LLP; Steven Meyers

(57) ABSTRACT

Methods, systems and computer program products for extending the shelf life of non-volatile memory devices, aspects of which include detecting that the non-volatile memory device has been disconnected from a power supply and responsively resetting a timer, a first counter, and a second counter and incrementing the first counter and the second counter based on the timer. Based on a determination that the first counter has reached a first threshold value, aspects also include initiating a wireless charging a battery of the non-volatile memory device. Based on a determination that the second counter has reached a second threshold value, aspects also include initiating a refresh of a non-violate memory of the non-volatile memory device. Based on a determination that the refresh of the non-violate memory of the non-volatile memory device has been completed, aspects also include resetting the timer, the first counter, and the second counter.

20 Claims, 5 Drawing Sheets

(52) U.S. Cl.
CPC .......... *G06F 3/0655* (2013.01); *G06F 3/0688* (2013.01); *G11C 11/406* (2013.01)

(56) References Cited

U.S. PATENT DOCUMENTS

| | | | |
|---|---|---|---|
| 9,632,866 B2 | 4/2017 | Calderbank et al. | |
| 2004/0160838 A1* | 8/2004 | Pelley | G11C 7/1045 365/222 |
| 2008/0250189 A1 | 10/2008 | Cheng | |
| 2009/0058361 A1* | 3/2009 | John | A61N 1/3785 320/128 |
| 2009/0249008 A1 | 10/2009 | Hosaka | |
| 2010/0156343 A1* | 6/2010 | Jung | H02J 7/025 320/108 |
| 2011/0140541 A1* | 6/2011 | Ryu | H02J 7/0045 307/104 |
| 2012/0040712 A1* | 2/2012 | Toms | G06F 11/1048 455/550.1 |
| 2013/0311700 A1 | 11/2013 | Chen | |
| 2015/0081958 A1 | 3/2015 | Li | |
| 2016/0253097 A1 | 9/2016 | Toyoda | |

* cited by examiner

EXTENDING SHELF LIFE OF NON-VOLATILE MEMORY DEVICES

BACKGROUND

The present invention generally relates to non-volatile memory devices, and more particularly to methods and systems extending the shelf life of non-volatile memory devices.

In general, non-volatile memory is used for secondary storage or long-term persistent storage. One widely used form of primary storage today is a volatile form of random access memory (RAM), meaning that when the computer is shut down, anything contained in RAM is lost. Non-volatile memory technologies can be attached to computer systems as storage, such as DRAM, and can be used for long term storage that is not attached to a computer system, such as magnetic tape.

Currently for storage where a device is not accessed for long periods, sometimes years (termed "very cold storage"), tape is an attractive often used technology because it has a very long retention time. In contrast, data retention time for solid state non-volatile memory devices is limited and must be considered not only during runtime, but when these are on shelves in distribution warehouses or customer locations. Currently, when a non-volatile memory device is powered off there is no existing methodology to refresh their data in order to extend the shelf life of the non-volatile memory device.

In one example, a flash drive may have a data retention life of three months, meaning that beyond the time period of three months, there is a risk of losing the data as well as unpredictable firmware behavior the next time it is powered on.

SUMMARY

In accordance with an embodiment, a method for extending the shelf life of non-volatile memory device is provided. The method includes detecting that the non-volatile memory device has been disconnected from a power supply and responsively resetting a timer, a first counter, and a second counter and incrementing the first counter and the second counter based on the timer. Based on a determination that the first counter has reached a first threshold value, the method also includes initiating a wireless charging a battery of the non-volatile memory device. Based on a determination that the second counter has reached a second threshold value, the method also includes initiating a refresh of a non-violate memory of the non-volatile memory device. Based on a determination that the refresh of the non-violate memory of the non-volatile memory device has been completed, the method further includes resetting the timer, the first counter, and the second counter.

In accordance with another embodiment, a computer program product for extending the shelf life of non-volatile memory device is provided. The computer program product includes a non-transitory storage medium readable by a processing circuit and storing instructions for execution by the processing circuit for performing a method. The method includes detecting that the non-volatile memory device has been disconnected from a power supply and responsively resetting a timer, a first counter, and a second counter and incrementing the first counter and the second counter based on the timer. Based on a determination that the first counter has reached a first threshold value, the method also includes initiating a wireless charging a battery of the non-volatile memory device. Based on a determination that the second counter has reached a second threshold value, the method also includes initiating a refresh of a non-violate memory of the non-volatile memory device. Based on a determination that the refresh of the non-violate memory of the non-volatile memory device has been completed, the method further includes resetting the timer, the first counter, and the second counter.

In accordance with another embodiment, a non-volatile memory device comprising a non-violate memory, a battery and a processor, the processor configured to detect that the non-volatile memory device has been disconnected from a power supply and responsively resetting a timer, a first counter, and a second counter and increment the first counter and the second counter based on the timer. Based on a determination that the first counter has reached a first threshold value, the processor is also configured to initiate a wireless charging a battery of the non-volatile memory device. Based on a determination that the second counter has reached a second threshold value, the processor is also configured to initiate a refresh of a non-violate memory of the non-volatile memory device. Based on a determination that the refresh of the non-violate memory of the non-volatile memory device has been completed, the processor is further configured to reset the timer, the first counter, and the second counter.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Embodiments include methods, systems, and computer program products for extending a shelf life of a non-volatile memory device. The non-volatile memory device includes a battery that is used to refresh the non-volatile memory in the non-volatile memory device and a wireless charging device that is used to charge the battery. In exemplary embodiments, the non-volatile memory device is configured to detect when it has been disconnected from a power supply and to responsively start a timer. The timer is used to increment two separate counters, one for determining when to charge the battery and one for determining when to refresh the non-volatile memory. In exemplary embodiments, since the data retention life of non-volatile memory can be affected by temperature, the counters are incremented based on the time and based on an ambient temperature of the non-volatile memory device.

Figure 1:
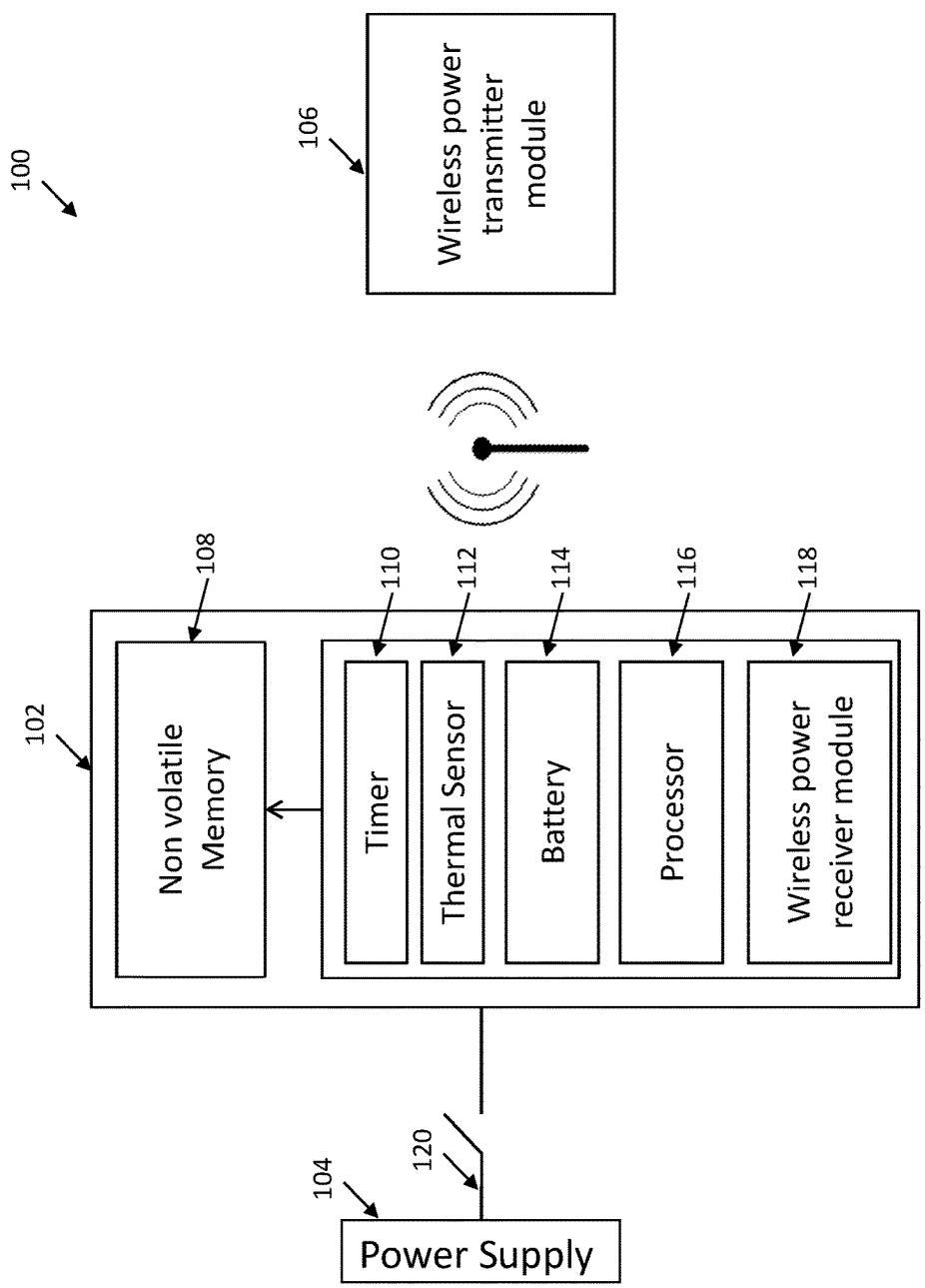
FIG. 1 is a block diagram of a system for extending a shelf life of a non-volatile memory device in accordance with an embodiment.

Referring to FIG. 1, a block diagram of a system 100 for extending a shelf life of a non-volatile memory device 102 in accordance with an embodiment is shown. As illustrated, the non-volatile memory device 102 may be connected to a power supply 104 via connection 120 and the non-volatile memory device 102 is within the range of a wireless power transmitter module 106. The non-volatile memory device 102 includes a timer 110, a thermal sensor, 112, a battery 114, a processor 116 and a wireless power receiver module 118.

In exemplary embodiments, the processor 116 is configured to monitor the connection of the non-volatile memory device 102 to the power supply 104 and to detect if the non-volatile memory device 102 is disconnected from the power supply 104. Once it is determined that the non-volatile memory device 102 has been disconnected from the power supply 104, the processor 116 resets a timer and a first and second counter maintained by the processor 116. The first counter and the second counter are incremented by the processor based on the timer. In exemplary embodiments, the first and/or second counter can be incremented based on the timer and based on the temperature of the non-volatile memory device 102, as indicated by the thermal sensor 112. In exemplary embodiments, the rate that which the first and/or second counter are incremented is positively correlated with the temperature of the non-volatile memory device 102. In other words, as the temperature of the non-volatile memory device 102 increases, the first and/or second counter can be incremented more quickly to account for the effects of the increased temperature on the data retention life of non-volatile memory 108.

In exemplary embodiments, the wireless power receiver module 118 is configured to receive power from the wireless power transmitter module 106 and to responsively charge the battery 114. The wireless power receiver module 118 and the wireless power transmitter module 106 can utilize any suitable wireless power transmission technology that are known to those of ordinary skill in the art. In exemplary embodiments, the wireless power receiver module 118 is controlled by the processor 116.

Figure 2:
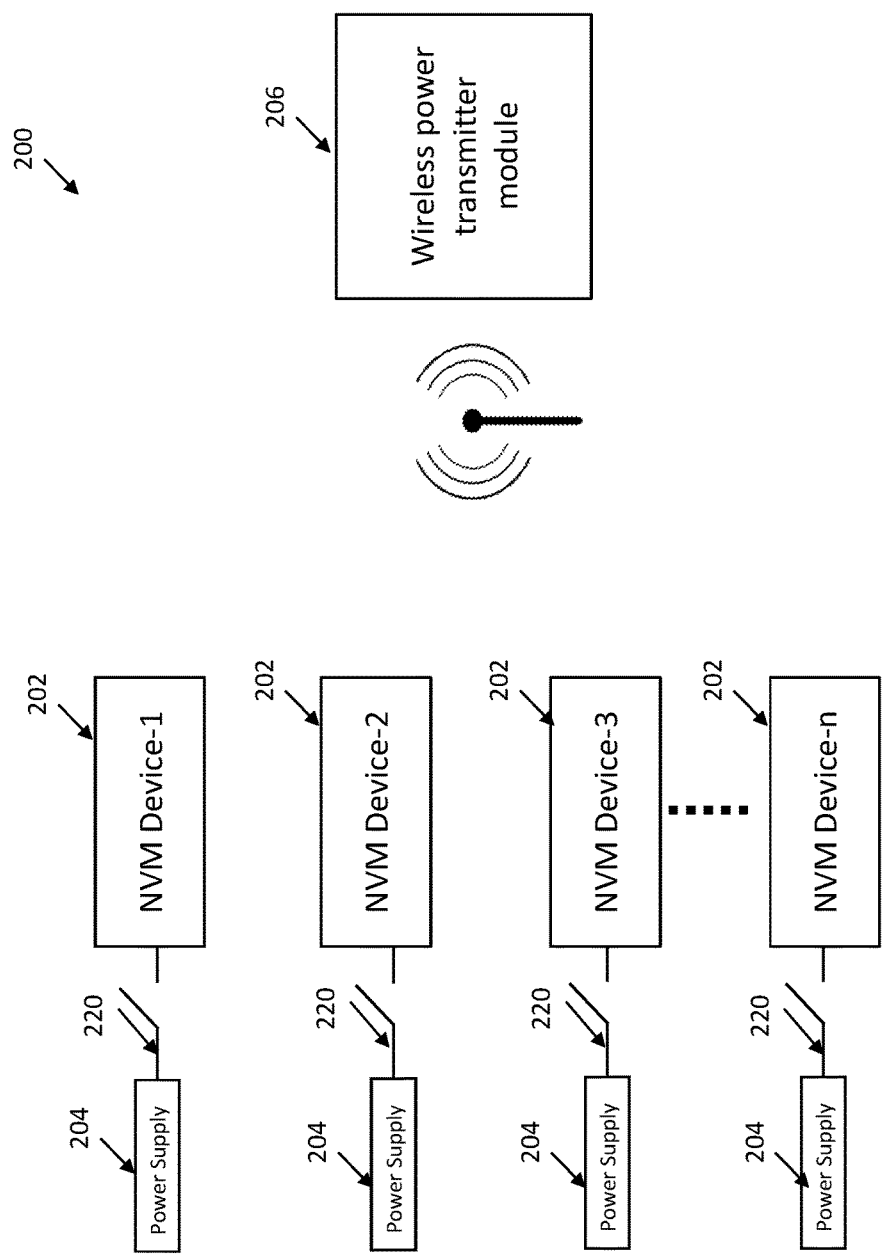
FIG. 2 is a block diagram illustrating a system for extending a shelf life of multiple non-volatile memory devices in accordance with an embodiment.

Referring now to FIG. 2, a system 200 for extending a shelf life of multiple non-volatile memory (NVM) devices 202 in accordance with an embodiment is shown. The system 200 includes a plurality of NVM devices 202, which are similar to the non-volatile memory device 102 shown in FIG. 1, and a wireless power transmitter module 206, which is within the range of the plurality of NVM devices 202. In one embodiment, each of the plurality of NVM devices 202 may be connected to a power supply 204 by a connection 220. In another embodiment, the plurality of NVM devices 202 may be connected to a single power supply 204 by a connector 220. In exemplary embodiments, the system 200 can be used to extend the shelf life of the NVM devices 202 by selectively wirelessly charging and refreshing the NVM devices 202.

Figure 3:
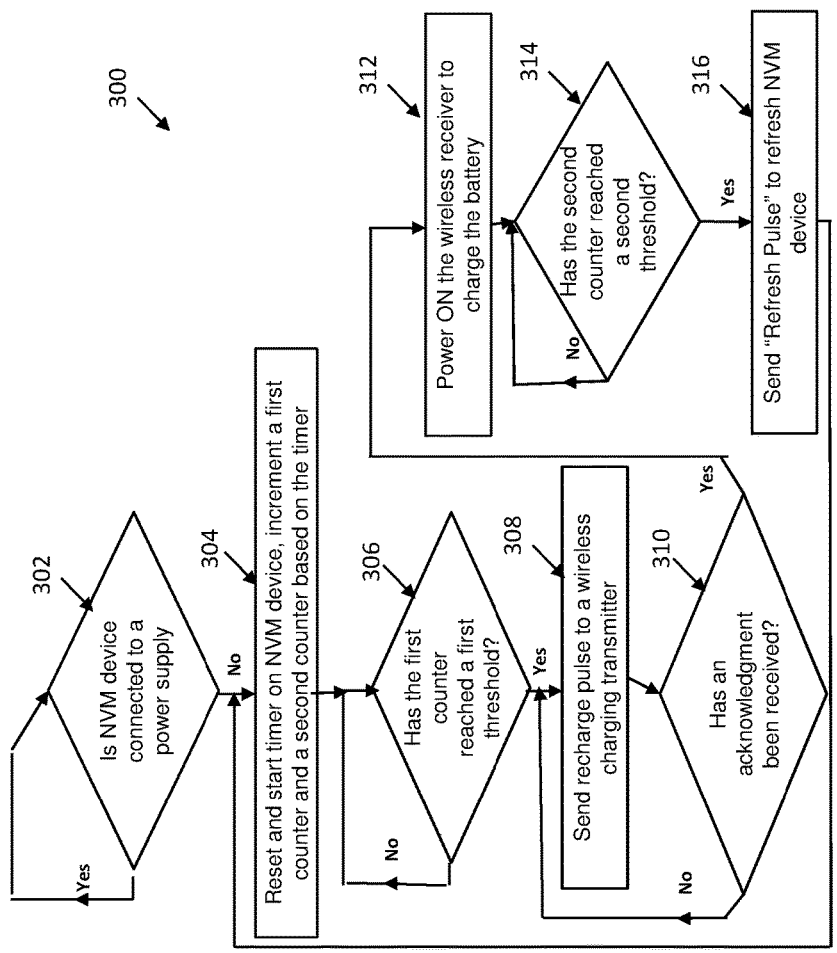
FIG. 3 is a flow chart illustrating a method for extending a shelf life of a non-volatile memory device in accordance with an embodiment.

Referring now to FIG. 3, a flowchart illustrating a method 300 extending a shelf life of a non-volatile memory (NVM) device is shown. As shown at decision block 302, the method 300 includes determining if the NVM device is connected to a power supply. If the non-volatile memory device is not connected to a power supply, the method 300 proceeds to block 304 and includes resetting and starting a timer, incrementing a first counter and a second counter based on the timer.

In exemplary embodiments, the first counter is incremented based on the timer. For example, the first counter can be configured to be incremented once every minute, two minutes, or five minutes. In exemplary embodiments, the rate at which the first counter is incremented can be based on a temperature reading from the thermal sensor of the NVM device. For example, as the temperature of the NVM device increases, the rate that the counter is incremented can increase. Likewise, the second counter can be incremented in a similar manner to the first counter, i.e., based on the timer and the temperature of the non-volatile memory device. In exemplary embodiments, the rate that the first counter and the second counter are incremented are not equal to each other.

Next, as shown at decision block 306, the method includes determining if the first counter has reached the first threshold. If the first counter has reached the first threshold, the method proceeds to block 308 and includes sending a recharge pulse to a wireless charging transmitter. In exemplary embodiments, the wireless charging transmitter is configured to initiate a wireless charging cycle based on receiving a recharge pulse.

Next, as shown at decision block 310, the method 300 includes determining if an acknowledgment is received from the wireless charging transmitter. If an acknowledgment has been received from the wireless charging transmitter, the method 300 continues to block 312 and includes powering on the wireless receiver to charge the battery of the NVM device. Next, as shown at decision block 314, the method includes determining if the second counter has reached the second threshold. If the second counter has reached the second threshold, the method proceeds to block 316 and includes sending a refresh pulse to the NVM device. In exemplary embodiments, the refresh pulse causes the non-volatile memory device to initiate a refresh cycle on the non-volatile memory. The refresh cycle of the non-volatile memory is a well-known process that can be performed in any well-known manner. After the refresh cycle is completed, the method 300 returns to block 304.

Figure 4:
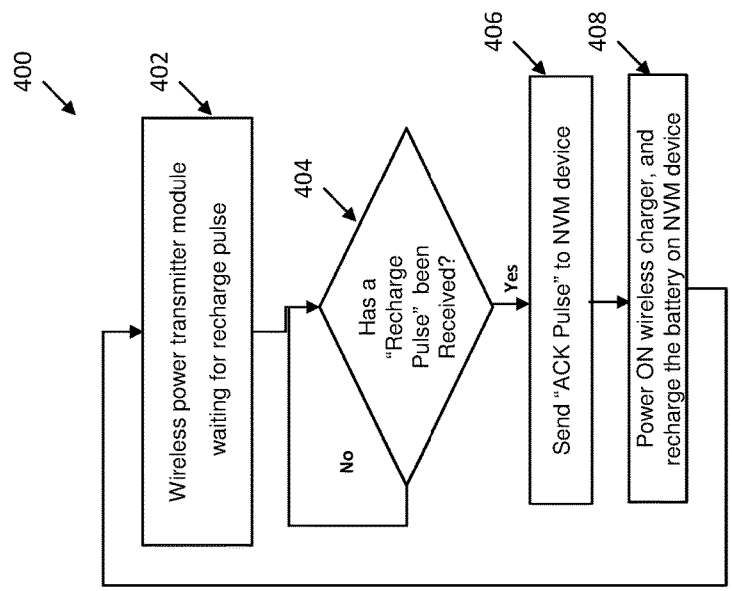
FIG. 4 is a flow chart illustrating a method for charging a non-volatile memory device in accordance with an embodiment.

Referring now to FIG. 4, a flowchart illustrating a method 400 for charging a non-volatile memory device is shown. As shown at block 402, the method 400 includes waiting by the wireless power transmitter module for a recharge pulse. At decision block 404, the method 400 determines if a recharge pulse has been received. Once a recharge pulse is received, the method 400 proceeds to block 406 and includes sending an acknowledgment message to the non-volatile memory device that transmitted the recharge pulse. In exemplary embodiments, the recharge pulse includes an identification number of the non-volatile memory device transmitting the recharge pulse and the acknowledgment message also includes the identification number. Next, as shown at block 408, the method 400 includes turning on the wireless power transmitter and the wireless power receiver module and recharging the battery on non-volatile memory device. Once the battery of the non-volatile memory device is fully charged, the method 400 returns to block 402.

Figure 5:
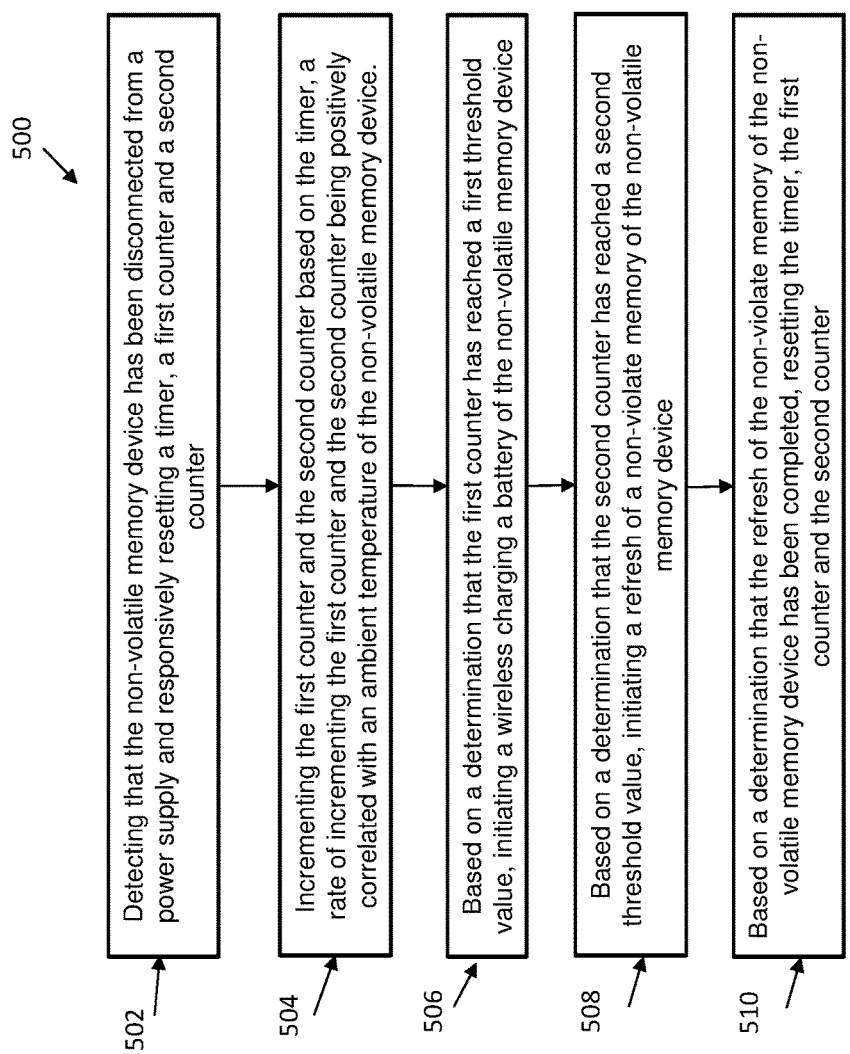
FIG. 5 is a flow chart illustrating another method for extending a shelf life of a non-volatile memory device in accordance with an embodiment.

Referring now to FIG. 5, a flowchart illustrating a method 500 extending a shelf life of a non-volatile memory device is shown. As shown at block 502, the method 500 includes detecting that the non-volatile memory device has been disconnected from a power supply and responsively resetting a timer, a first counter, and a second counter. Next, as shown at block 504, the method 500 includes incrementing the first counter and the second counter based on the timer. In exemplary embodiments, the first counter and/or the second counter can be incremented based on the timer and based on an ambient temperature of the non-volatile memory device. In one embodiment, in order to account for the effects of temperature on the data retention life of the non-volatile memory device, the rate that the first counter and the second counter are incremented are positively correlated with the ambient temperature of the non-volatile memory device. In other words, as the temperature of the non-volatile memory device increases, the first and/or second counter are incremented more frequently.

The method 500 also includes initiating a wireless charging a battery of the non-volatile memory device based on a determination that the first counter has reached a first threshold value, as shown at block 506. In exemplary embodiments, the first counter is reset based on a determination that the battery of the non-volatile memory device has been fully charged. As shown at block 508, the method 500 includes, based on a determination that the second counter has reached a second threshold value, initiating a refresh of a non-violate memory of the non-volatile memory device. In exemplary embodiments, the second threshold value is determined based on a data retention life of the non-volatile memory device. For example, if the data retention life of the non-volatile memory device is thirty days the second threshold can be set to twenty-five days, or any other suitable value that is less that the data retention life of the non-volatile memory device. In exemplary embodiments, the second threshold value is less than the data retention life of the non-volatile memory device and larger than the first threshold value.

The method 500 also includes resetting the timer, the first counter and the second counter based on a determination that the refresh of the non-violate memory of the non-volatile memory device has been completed, as shown at block 510. In exemplary embodiments, the method 500 also includes resetting the first counter and the second counter based on a determination that the non-volatile memory device has been reconnected to the power supply.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method for extending a shelf life of a non-volatile memory device, the method comprising:
   detecting, by a processor of the non-volatile memory device, that the non-volatile memory device has been disconnected from a power supply and responsively resetting a timer, a first counter, and a second counter;
   incrementing the first counter and the second counter based on the timer;
   based on a first determination that the first counter has reached a first threshold value, initiating a wireless charging a battery of the non-volatile memory device;
   based on a second determination that the second counter has reached a second threshold value, initiating a refresh of a non-violate memory of the non-volatile memory device;
   based on a third determination that the refresh of the non-violate memory of the non-volatile memory device has been completed, resetting the timer, the first counter, and the second counter; and
   when a fourth determination that the battery of the non-volatile memory device is fully charged, resetting the first counter.

2. The method of claim 1, wherein the first counter is incremented at a first rate and the second counter is incremented at a second rate, which is not equal to the first rate.

3. The method of claim 1, wherein the second threshold value is determined based on a data retention life of the non-volatile memory device.

4. The method of claim 1, wherein the second threshold value is larger than the first threshold value.

5. The method of claim 1, wherein incrementing the first counter and the second counter is further based on an ambient temperature of the non-volatile memory device.

6. The method of claim 5, wherein a rate of incrementing the first counter and the second counter is positively correlated with the ambient temperature of the non-volatile memory device.

7. The method of claim 1, further comprising resetting the first counter and the second counter based on a fifth determination that the non-volatile memory device has been reconnected to the power supply.

8. A computer program product for extending a shelf life of a non-volatile memory device, the computer program product comprising:
   a non-transitory storage medium readable by a processing circuit and storing instructions for execution by the processing circuit for performing a method comprising:
   detecting that the non-volatile memory device has been disconnected from a power supply and responsively resetting a timer, a first counter, and a second counter;
   incrementing the first counter and the second counter based on the timer;
   based on a first determination that the first counter has reached a first threshold value, initiating a wireless charging a battery of the non-volatile memory device;
   based on a second determination that the second counter has reached a second threshold value, initiating a refresh of a non-violate memory of the non-volatile memory device;
   based on a third determination that the refresh of the non-violate memory of the non-volatile memory device has been completed, resetting the timer, the first counter, and the second counter: and
   when a fourth determination that the battery of the non-volatile memory device is fully charged, resetting the first counter.

9. The computer program product of claim 8, wherein the first counter is incremented at a first rate and the second counter is incremented at a second rate, which is not equal to the first rate.

10. The computer program product of claim 8, wherein the second threshold value is determined based on a data retention life of the non-volatile memory device.

11. The computer program product of claim 8, wherein the second threshold value is larger than the first threshold value.

12. The computer program product of claim 8, wherein incrementing the first counter and the second counter is further based on an ambient temperature of the non-volatile memory device.

13. The computer program product of claim 12, wherein a rate of incrementing the first counter and the second counter is positively correlated with the ambient temperature of the non-volatile memory device.

14. The computer program product of claim 8, wherein the method further comprises resetting the first counter and the second counter based on a fifth determination that the non-volatile memory device has been reconnected to the power supply.

15. A non-volatile memory device comprising a non-violate memory, a battery and a processor, the processor configured to:
   detect that the non-volatile memory device has been disconnected from a power supply and responsively reset a timer, a first counter, and a second counter;
   increment the first counter and the second counter based on the timer;
   based on a first determination that the first counter has reached a first threshold value, initiate a wireless charging of the battery;

based on a second determination that the second counter has reached a second threshold value, initiate a refresh of the non-violate memory;

based on a third determination that the refresh of the non-violate memory of the non-volatile memory device has been completed, reset the timer, the first counter, and the second counter; and when a fourth determination that the battery of the non-volatile memory device is fully charged, reset the first counter.

16. The non-volatile memory device of claim 15, wherein the first counter is incremented at a first rate and the second counter is incremented at a second rate, which is not equal to the first rate.

17. The non-volatile memory device of claim 15, wherein the second threshold value is determined based on a data retention life of the non-volatile memory device.

18. The non-volatile memory device of claim 15, wherein the second threshold value is larger than the first threshold value.

19. The non-volatile memory device of claim 15, wherein incrementing the first counter and the second counter is further based on an ambient temperature of the non-volatile memory device.

20. The non-volatile memory device of claim 19, wherein a rate of incrementing the first counter and the second counter is positively correlated with the ambient temperature of the non-volatile memory device.

* * * * *